(12) United States Patent
Choi et al.

(10) Patent No.: US 6,335,284 B1
(45) Date of Patent: Jan. 1, 2002

(54) METALLIZATION PROCESS FOR MANUFACTURING SEMICONDUCTOR DEVICES

(75) Inventors: Baik-soon Choi, Anyang; Jae-saeng Lee, Suwon; Eun-hee Shin, Seoul; Sung-bum Cho, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/386,360

(22) Filed: Aug. 31, 1999

(30) Foreign Application Priority Data

Sep. 24, 1998 (KR) .................................................. 98-39667

(51) Int. Cl.⁷ ................................................. H01L 21/461
(52) U.S. Cl. ............................ 438/689; 438/704; 438/710
(58) Field of Search ..................................... 438/710, 711, 438/720, 704, 745, 713, 798

(56) References Cited

U.S. PATENT DOCUMENTS 5,545,289 A * 8/1996 Chen et al. ................. 156/643.1
6,090,717 A * 7/2000 Powell et al. ................. 438/710
6,177,353 B1 * 1/2001 Gutsche et al. .............. 438/704

* cited by examiner

*Primary Examiner*—David Nelms
*Assistant Examiner*—Dung Aus Le
(74) *Attorney, Agent, or Firm*—The Law Offices of Eugene M. Lee, PLLC

(57) ABSTRACT

A metallization process for manufacturing semiconductor devices and a system that uses the same that minimizes corrosion failures in aluminum patterns. The process for the metal pattern formation is carried out by loading a semiconductor wafer into an etching chamber, the semiconductor wafer having a photoresist pattern formed over a metal material layer, stabilizing the environment in the etching chamber, main-etching the metal material layer to the etch-end point by using the photoresist pattern as an etch mask while supplying etching gas containing chlorine (Cl$_2$) into the etching chamber, over-etching the metal material layer for a certain period of time over the etch-end point so as to form metal patterns, purging the etching chamber after the over-etching step, and unloading the wafer from the etching chamber. The pressure in the transfer module is optimized, and the load lock chamber is continuously purged.

12 Claims, 12 Drawing Sheets

METALLIZATION PROCESS FOR MANUFACTURING SEMICONDUCTOR DEVICES

BACKGROUND OF THE INVENTION

1. Field of the Invention

The present invention relates to a metallization process for manufacturing semiconductor devices and a system used in the same and, more particularly, to a metal pattern formation process that minimizes corrosion failures in aluminum pattern.

2. Description of the Related Art

A metal pattern formation process for manufacturing semiconductor devices provides electrical interconnection between the devices formed on a semiconductor substrate. The process is carried out by forming a metal material layer on a certain layer over the semiconductor substrate, coating the metal material layer with photoresist, exposing and developing the photoresist according to a predetermined pattern so as to form a photoresist pattern, etching the metal material layer using the photoresist pattern as an etch mask, and removing the photoresist pattern to form a desired metal pattern.

FIG. 1 schematically shows a conventional multichamber-type dry etching system, in which a series of processes, such as etching the metal material layer and removing the photoresist pattern, are carried out. The etching system shown in FIG. 1 is a product of AMT (Applied Materials Technology) Company (Model Name: Centura).

Referring to FIG. 1, the multichamber-type dry etching system comprises a transfer module 12 at its center and a plurality of processing chambers surrounding the transfer module 12. The transfer module 12 has a robot 14 for wafer transfer therein and maintains a constant level of vacuum by a pump (not shown). Each processing chamber is connected to the transfer module 12 via a slit valve 19. The chambers are: load lock chambers 10a, 10b serving as a stand-by area for the wafers before/after a process, a flat-zone aligner 20 for aligning the flat-zone of the wafer for a process, etching chambers 16a, 16b for carrying out the etching process to form the metal pattern, ashing chambers 18a, 18b for stripping the remaining photoresist pattern after the etching process and for passivation, and a cooling chamber 22. Utility lines are connected to each chamber, if necessary.

FIG. 2 shows the structure of the etching chamber 16a shown in FIG. 1, which is a MERIE (Magnetron Enhanced Reactive Ion Etch) type dry etching chamber. The etching chamber employs radio frequency (RF) power to generate plasma for reactive ion etch under low pressure. Additionally, a magnetic coil 38 is further provided along the sidewall of the interior 30 of the etching chamber 16a as shown in FIG. 2. The magnetic coil 38 generates a magnetic field in addition to the electric field generated in the chamber 16a by the RF power. The additional magnetic field focuses the ions around the sidewall of the interior 30 of the chamber 16a and forces the ions into the plasma formed at the center of the interior 30 of the chamber 16a. This increases the density of the plasma and keeps the plasma maintained for a longer period. Therefore, a high etch rate is achieved.

Referring to FIG. 2 in more detail, a wafer 42 is mounted on an electrostatic chuck 46. The electrostatic chuck 46 is installed over a cathode 48 at the center of the interior 30 of the chamber 16a, and a focus ring 44 is provided under the wafer 42 to facilitate the focusing of the plasma. High frequency power is applied on the cathode 48 and the focus ring 44.

A chamber liner 32 is formed at the upper side of the chamber 16a. A gas disperse plate 34 for supplying processing gas over the wafer 42 is provided at the center of the chamber liner 32, and the gas disperse plate 34 is connected to a gas supply line 36.

On the sidewall of the interior 30 of the chamber 16a, a detector 40 for measuring the etch-end point is provided. On the bottom of the interior 30 of the chamber 16a, an exhaust port is provided and is connected to a turbo molecular pump 50 for maintaining a desired level of vacuum in the chamber 16a.

The wafer 42 has a metal material layer formed on an insulating layer over the wafer, and a photoresist pattern is formed on the metal material layer to form a desired metal pattern. An etching process is carried out on the wafer 42 in the etching chamber 16a shown in FIG. 2 while supplying processing gas. Chlorine ($Cl_2$) gas and boron chloride ($BCl_3$) gas is used as the processing gas for etching aluminum, which is generally used for metal patterns.

However, if gas including chlorine is used as the processing gas in the aluminum pattern formation process, corrosion problems occur in the metal pattern line because aluminum is subject to corrosion by the processing gas.

FIG. 3 is a plane-view of a wafer segment showing corrosion formed on a conventional aluminum pattern line. A metal pattern line 62 is formed on an insulating layer 60 over a semiconductor substrate. Parts of the aluminum pattern line 62 are corroded, which are shown as corrosion portions 69 in FIG. 3. The corrosion portions 69 may expand, resulting in open circuits in the metal pattern line 62. This causes electrical connection failure in semiconductor devices and reduces the production yield.

The corrosion failure in aluminum patterns is known to be caused by HCl which is created by the reaction of vapor with chlorine components in the photoresist and in the sidewall coating of the chamber or with $AlCl_3$, a by-product of the etching process. Although a lot of study has been done on corruption failure, there is still no reliable explanation for the cause and no improvement.

Especially, U.S. Pat. No. 5,545,289 discloses a method of carrying out the ashing step by repeating passivation and stripping in order to reduce the corrosion failure. The ashing step is carried out to remove remaining photoresist patterns after the etching process on the metal material layer. However, the method does not solve the corrosion failure problem because it does not eliminate the cause of the corrosion failure.

Therefore, there has been a need for improving the systems and processes in order to reduce corrosion failure in aluminum pattern lines, thereby improving the reliability and the production yield of semiconductor devices.

SUMMARY OF THE INVENTION

It is a feature of the present invention to provide a metallization process that can reduce the corrosion failures in aluminum pattern lines, by suppressing any cause of the corrosion failures in an etching chamber in which the etching process for the metallization is carried out.

Another feature of the present invention is to provide a metallization process that can reduce the corrosion failures in aluminum pattern lines, by suppressing any cause of the corrosion failures in the transfer module and the load lock chamber, which are stand-by areas for the wafers before or after the etching process.

Still another feature of the present invention is to provide a system for forming metal patterns that can reduce the corrosion failures in aluminum pattern lines.

The metallization process for manufacturing semiconductor devices of the present invention comprises the steps of loading a semiconductor wafer into an etching chamber, the semiconductor wafer having a photoresist pattern formed over a metal material layer to be etched, stabilizing the environment in the etching chamber, main-etching the metal material layer to the etch-end point by using the photoresist pattern as an etch mask while supplying etching gas containing chlorine ($Cl_2$) into the etching chamber, over-etching the metal material layer for a certain period of time over the etch-end point to form a metal pattern, purging the etching chamber after the over-etching step, and unloading the wafer from the etching chamber.

The metal material layer to be etched contains aluminum, and the etching gas contains boron chloride ($BCl_3$) and chlorine ($Cl_2$). The etching chamber is purged by supplying purified nitrogen ($PN_2$) gas into the chamber.

In another aspect of the present invention, the metallization process for manufacturing semiconductor devices of the present invention comprises the steps of loading a semiconductor wafer into a load lock chamber, the semiconductor wafer having a photoresist pattern formed over a metal material layer to be etched, pumping and purging the load lock chamber so as to maintain a certain level of vacuum therein, transferring the semiconductor wafer from the load lock chamber into an etching chamber via a transfer module, the transfer module being maintained at a certain level of vacuum and being purged, etching the metal material layer by using the photoresist pattern as an etch mask while supplying etching gas containing chlorine to form a metal pattern, purging the etching chamber after the etching step, transferring the wafer from the etching chamber into an ashing chamber via the transfer module, the transfer module being maintained at a certain level of vacuum, performing an ashing process on the metal patterns in the ashing chamber, and transferring the wafer from the ashing chamber into the load lock chamber via the transfer module, the load lock chamber being continuously purged and the transfer module being maintained at a certain level of vacuum.

The pressure in the load lock chamber and the transfer module is preferably maintained higher than that in the etching chamber and in the ashing chamber in order to prevent the gas remaining in the etching chamber and in the ashing chamber from flowing back into the load lock chamber and into the transfer module. The pressure in the etching chamber is from 50 to 300 mTorr. The pressure in the load lock chamber and the transfer module is maintained at least higher than 300 mTorr, preferably at 450 mTorr. The pressure in the transfer module can be optimized by connecting a RGA-QMS (Residual Gas Analyzer-Quadrupole Mass Spectrometer) to the load lock chamber and analyzing the movements of the impurities in the load lock chamber while varying the pressure in the transfer module.

In another aspect of the present invention, a system for forming metal patterns in semiconductor devices comprises a transfer module having a robot for wafer transfer therein, the transfer module being continuously purged under a certain level of vacuum, a load lock chamber connected to the transfer module via a slit valve, the load lock chamber being continuously purged under a certain level of vacuum after the wafer is supplied therein, an etching chamber connected to the transfer module via a slit valve, an etching process for the metal pattern formation being carried out therein by using a photoresist pattern as an etch mask, and an ashing chamber connected to the transfer module via a slit valve, an ashing process for removing the photoresist pattern and the etching by-products being carried out therein.

The transfer module and the load lock chamber are purged by using a single purge gas supply line. A RGA-QMS may be provided in the load lock chamber so as to monitor the movement of the impurities contained in the gas remaining in the load lock chamber.

It should be understood that both the foregoing general description and the following detailed description are exemplary and explanatory and merely provide an explanation of the claimed invention.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean patent application no. 98-39667, filed Sep. 24, 1998, is hereby incorporated by reference as if fully set forth herein. Specific embodiments of the present invention are shown in the accompanying drawings and the description below.

A feature of the present invention is to provide a system for carrying out the metallization process to maximize the suppression of chlorine ($Cl_2$) and hydrogen chloride (HCl), which are sources causing corrosion failures in the metal patterns, in the transfer module and the load lock chamber as well as in the etching chamber, and to optimize the process recipe of the etching process in the etching chamber.

To this end, the present invention provides the processing steps of optimizing the pressure in the transfer module, continuously purging the load lock chamber, and purging the etching chamber after over-etching in the etching chamber during the metallization process. The present invention also provides a system for carrying out the above processing steps.

Figure 4:
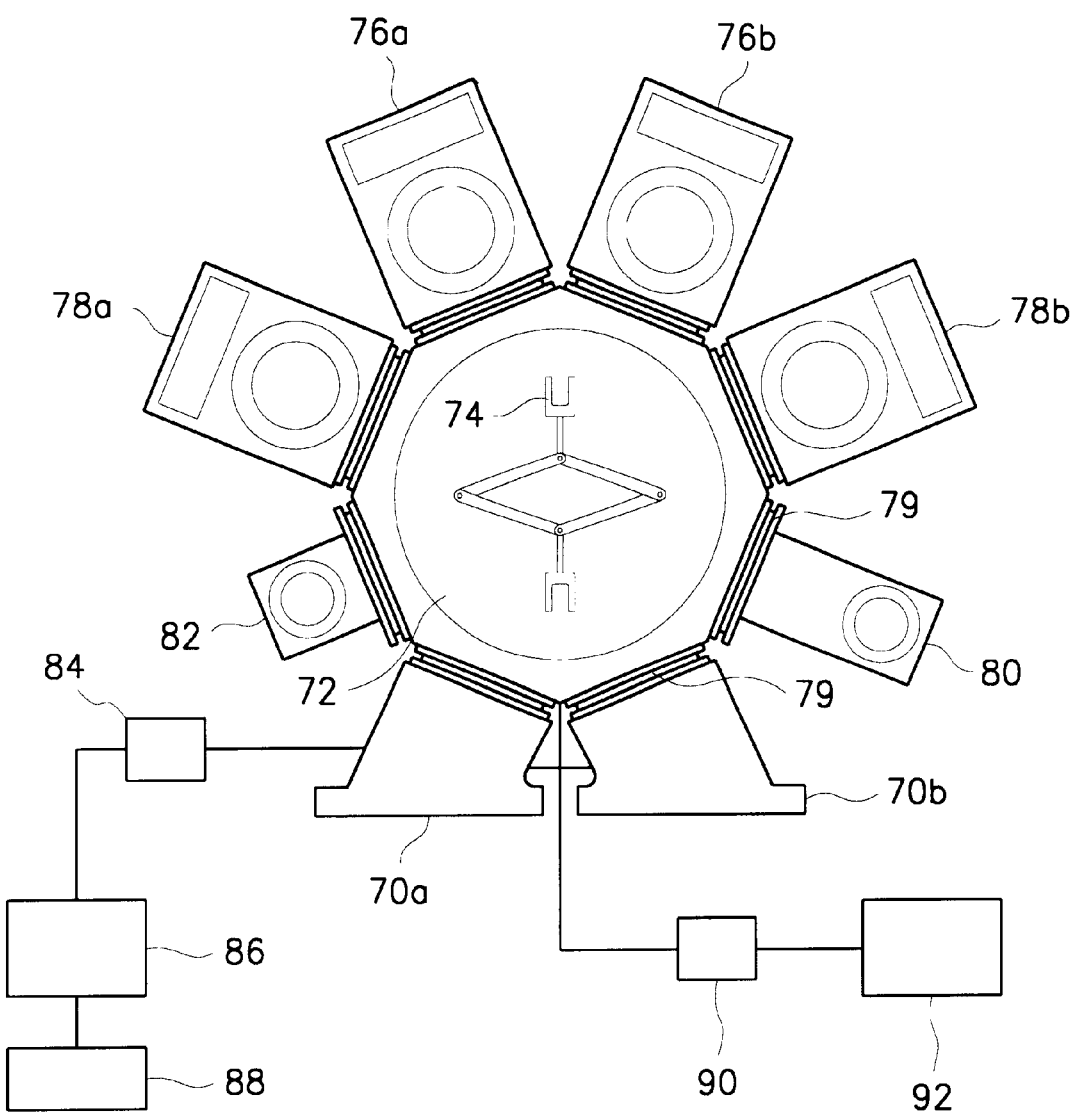
FIG. 4 schematically shows a dry etching system for carrying out a metallization process according to one embodiment of the present invention.

FIG. 4 shows a system for carrying out the metallization process for manufacturing semiconductor devices according to one embodiment of the present invention. The system is basically similar to the conventional system for metallization processes as shown in FIG. 1, except that a purge system for the load lock chamber and a system for analyzing the impurity movement in the load lock chamber is provided.

Referring to FIG. 4, a transfer module 72 is provided at the center of the system, the transfer module 72 being maintained at a constant level of vacuum by a mechanical pump (not shown). In the transfer module 72, a robot 74 for wafer transfer is provided. The transfer module 72 is surrounded by a plurality of chambers connected thereto through slit valves 79, forming a multichamber type system. The chambers surrounding the transfer module 72 are load lock chambers 70a, 70b serving as stand-by area for wafers before or after a process, a flat-zone aligner 80 for aligning the wafers for the process along their flat-zones, etching chambers 76a, 76b in which etching processes for the metal pattern formation are carried out in each etching chamber at the same time or sequentially with certain interval, ashing chambers 78a, 78b for carrying out a strip process and a passivation process separately or at the same time, a cooling chamber 82 for cooling the wafers to a certain temperature after completing the processes. Although not shown, various utility lines such as gas lines, pumping lines, electricity lines, cooling water lines or the like are connected to each chamber.

Figure 1:
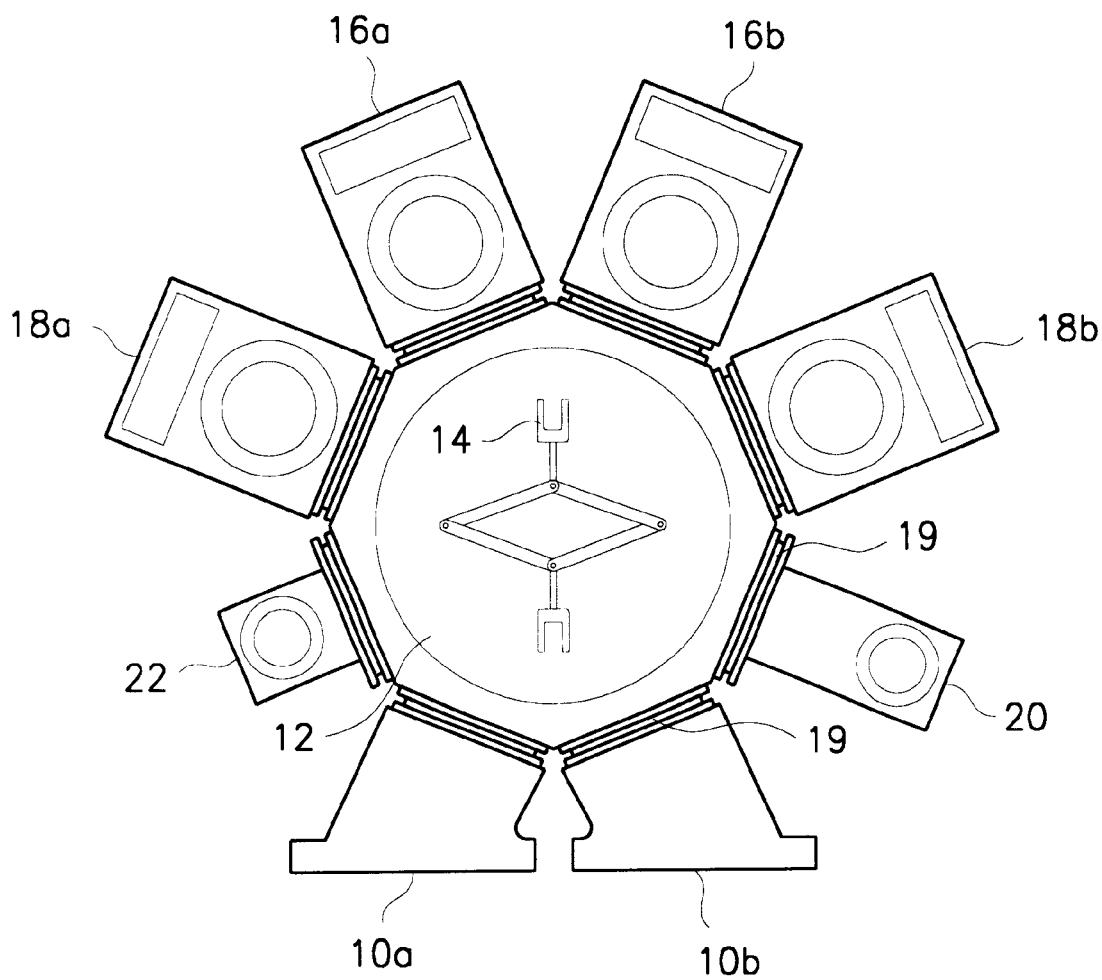
FIG. 1 schematically shows a conventional multichamber-type dry etching system for metallization processes.

Unlike the conventional system of FIG. 1, the system of the present invention has a sampling manifold 84 and an RGA-QMS 86 connected to the load lock chamber 70a so as to "in-line" sample the gas in the load lock chamber 70a and analyze the movement of the impurities. The sampling manifold 84 has an orifice of a certain diameter. The sampling manifold 84 and a vacuum pump 88 installed behind the RGA-QMS 86 perform the "in-line" sampling of the gas in the load lock chamber 70a by utilizing the difference in pressure between the RGA-QMS 86 and the load lock chamber 70a.

The RGA-QMS 86 used as a gas analyzer is a commercially well-known model. It samples gas used or remaining in a process chamber or in a process tube that is maintained at a certain level of vacuum. Then, electrons accelerated (e.g., at 70 electron volts (eV)) collide with the sample gas so as to ionize them. The ionized gas passes through the RGA-QMS which constantly maintains direct current and alternating current so as to allow only the ions having a specific mass to charge ratio (m/z) to pass through, thereby obtaining a spectrum of the sampled gas. Thus, the mechanism of the gas phase can be analyzed by studying the components of ions.

In addition, unlike conventional systems, the load lock chambers 70a, 70b are connected to the purge gas supply source 92, so that the load lock chambers 70a, 70b can be continuously purged by purge gas after wafers in a cassette are loaded into the load lock chambers. A mass flow controller 90 is installed on the purge gas supply line so as to control the flow of the purge gas. It is possible to use the purge gas supply source for the transfer module 72 in common as the purge gas supply source 92 shown in FIG. 4. However, the transfer module 72 and the load lock chambers 70a, 70b may also use separate purge gas supply sources, if necessary.

Figure 2:
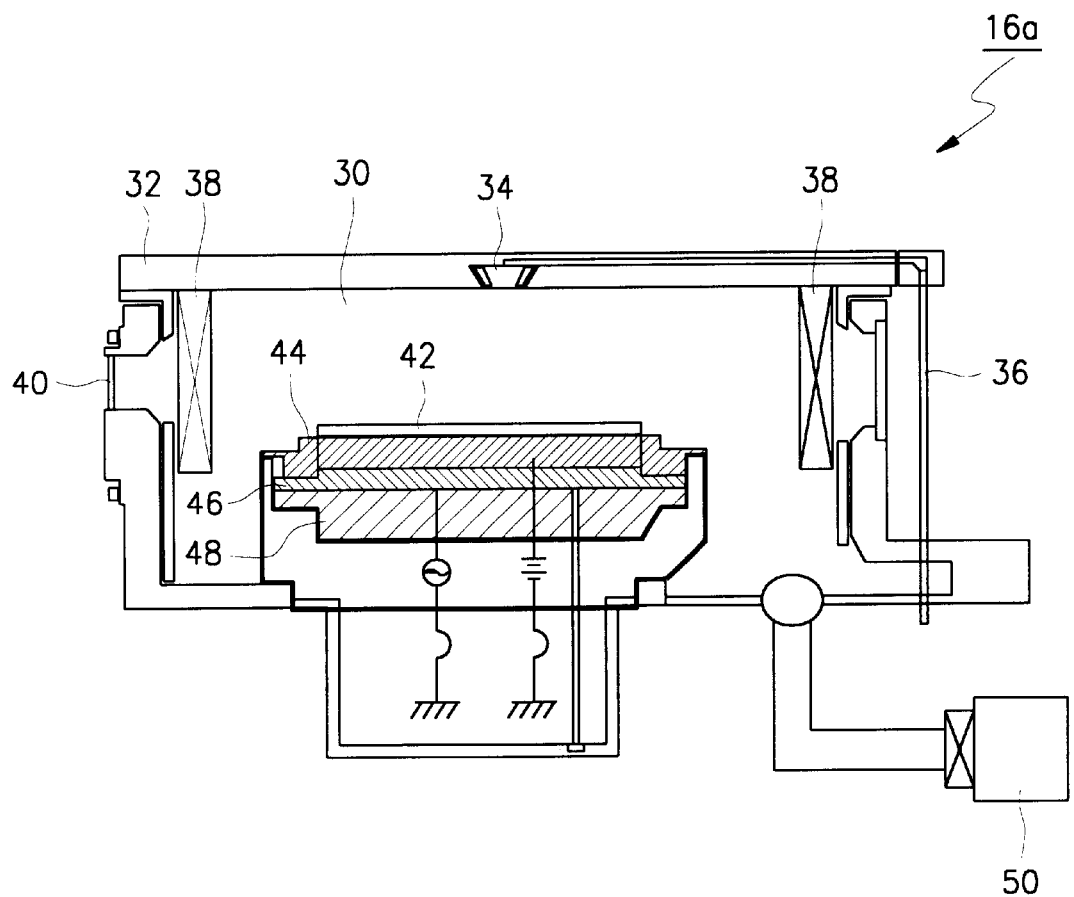
FIG. 2 schematically shows an etching chamber of the etching system shown in FIG. 1.
Figure 3:
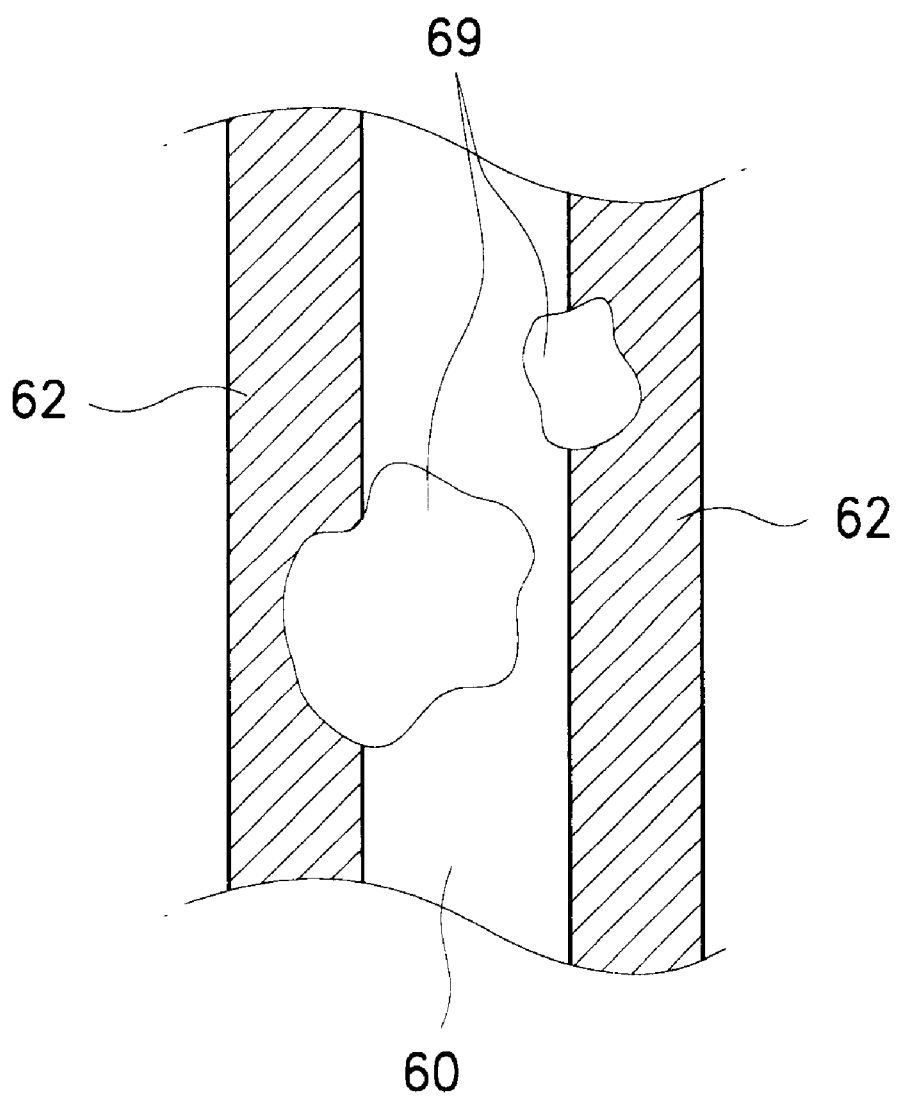
FIG. 3 shows the corrosion in a metal pattern after a conventional metal pattern formation process.

Meanwhile, the etching chambers 76a, 76b used in the embodiment of the present invention have substantially the same structure as that of the etching chamber 16a shown in FIG. 2.

Figure 6:
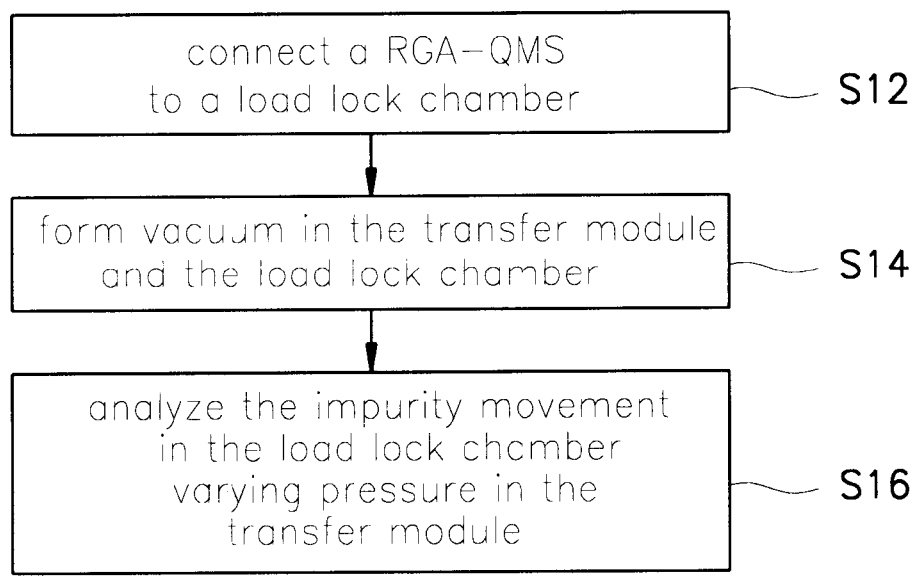
FIG. 6 is a flow chart illustrating the steps for optimizing the pressure in a transfer module of the dry etching system of FIG. 4 according to the present invention.
Figure 7:
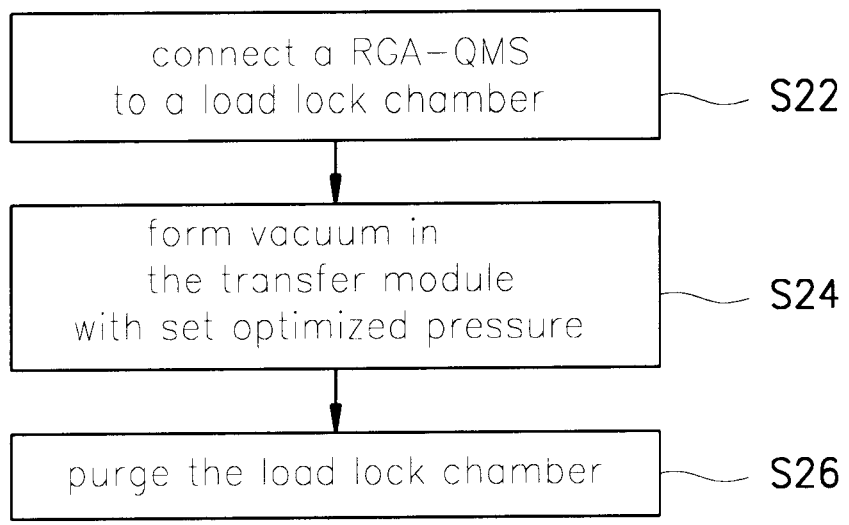
FIG. 7 is a flow chart illustrating the steps for purging a load lock chamber of the dry etching system of FIG. 4 after optimizing the pressure in the transfer module according to the present invention.

FIGS. 6 and 7 show the sequences for optimizing the pressure in the transfer module 72 in order to prevent corrosion failure in the metal patterns according to the present invention. The pressure in the transfer module 72 was not set at a certain level in conventional metallization processes. As shown in FIG. 4, impurity movements can be analyzed by using the RGA-QMS 86. The transfer module 72 and the load lock chambers 70a, 70b in FIG. 4 are maintained at a certain level of vacuum by a mechanical vacuum pump (not shown).

Referring to FIG. 6, a sampling manifold 84 is connected to the load lock chamber 70a of FIG. 4, and the RGA-QMS 86 is installed (S12). Then, the mechanical vacuum pump (not shown) connected to the transfer module 72 and the load lock chamber 70a is operated so as to create a vacuum pressure (S14). While varying the pressure in the transfer module 72, the impurity movement in the load lock chamber 70a can be analyzed by using the RGA-QMS 86 (S16).

Figure 10:
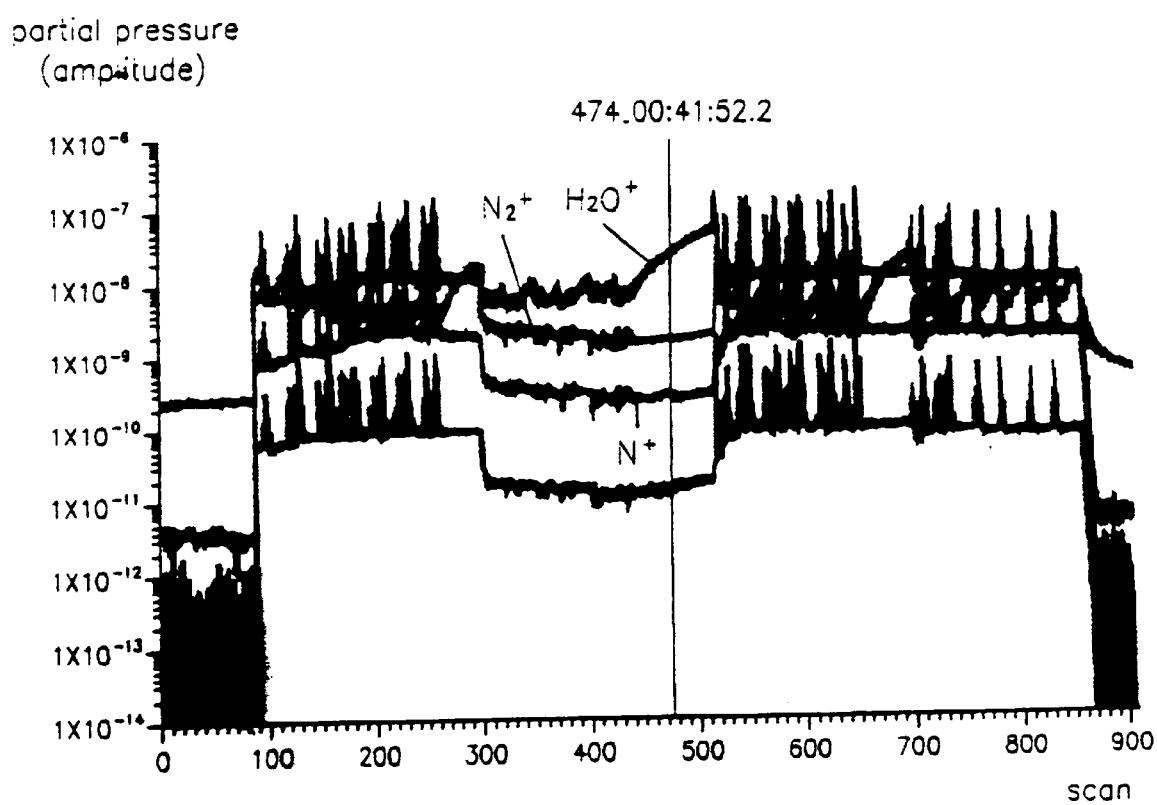
FIG. 10 is a graphical representation of measurements by a RGA-QMS (Residual Gas Analyzer-Quadrupole Mass Spectrometer) of the movement of $N_2$ and $H_2O$ in the load lock chamber while changing the pressure in the transfer module as shown in FIG. 6.
Figure 11:
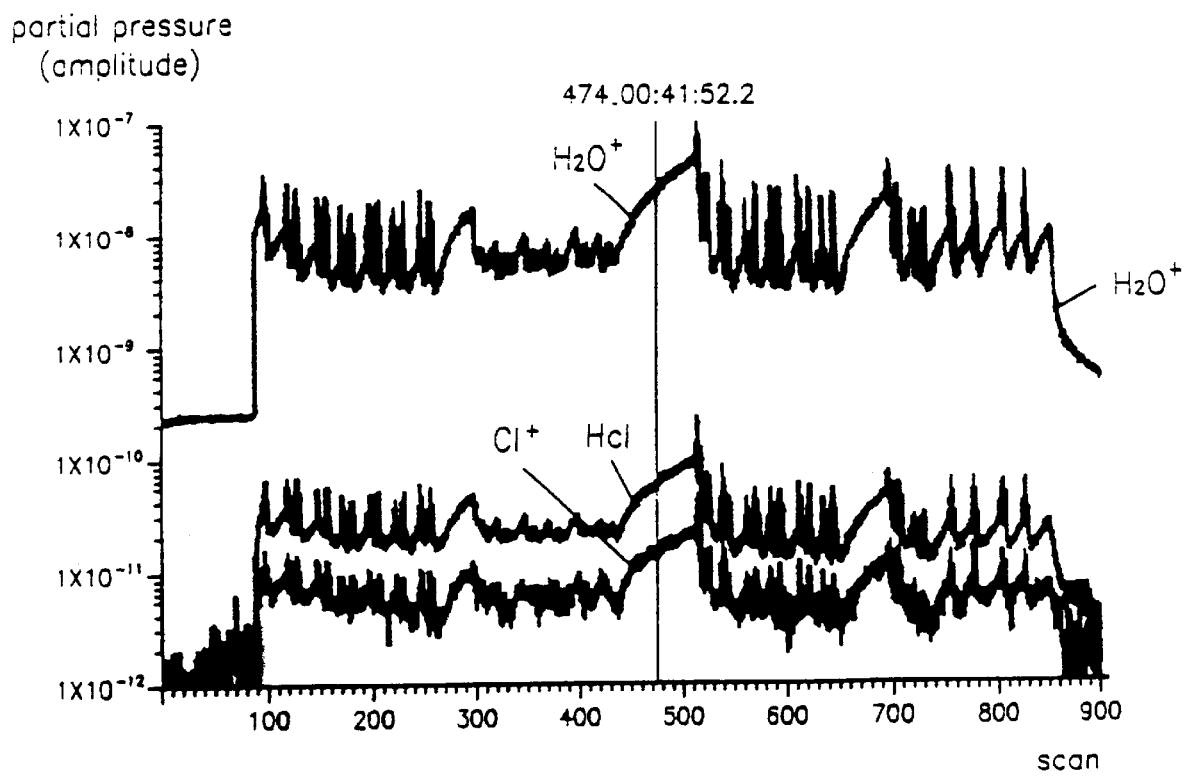
FIG. 11 is a graphical representation of measurements by a RGA-QMS of the movement of $H_2O$, Cl, and HCl in the load lock chamber while changing the pressure in the transfer module as shown in FIG. 6.

FIG. 10 shows the RGA-QMS measurement results of the movements of nitrogen ($N_2$) and water ($H_2O$) in the load lock chamber while varying the pressure in the transfer module according to the sequences shown in FIG. 6. FIG. 11 shows the RGA-QMS measurement results of the movements of water ($H_2O$), chlorine ($Cl_2$), hydrogen chloride (HCl) in the load lock chamber while varying the pressure in the transfer module according to the sequences shown in FIG. 6.

Referring to FIGS. 10 and 11, the x-axis of the graph represents the number of scans, which is the period of measurement in the RGA-QMS, and the y-axis represents the amplitude of partial pressure of the sample gas ions. As shown in FIGS. 10 and 11, the amplitude trend from 0 to 100 scans shows the background value of the remaining gas analyzer. The amplitude trend from 100 to 300 scans shows the results where $PN_2$ (Purified Nitrogen) is supplied into the transfer module 72 at 500 sccm (standard cubic centimeter per minute) to maintain the pressure in the transfer module 72 at 550 mTorr. The amplitude trend from 300 to 515 scans shows the results where $PN_2$ is not supplied so as to drop the pressure in the transfer module from 72 to 0 mTorr. The amplitude trend from 515 to 700 scans shows the results where $PN_2$ is supplied into the transfer module 72 at 700 sccm to maintain the pressure in the transfer module 72 at 700 mTorr. The amplitude trend from 700 to 855 scans shows the results where $PN_2$ is supplied into the transfer module 72 at 350 sccm to maintain the pressure in the transfer module 72 at 450 mTorr. The amplitude trend after 855 scans shows the background value.

Referring to the graphs shown in FIGS. 10 and 11, the movements of $H_2O^+$, $Cl^+$, and HCl are compared while setting the pressure in the transfer module 72 at 0/450/550/700 mTorr, respectively. The change of movement of $H_2O^+$ is small at 0 mTorr compared with that under other pressure conditions. However, the change of movement of $H_2O^+$ increases rapidly when the load lock chamber 72a and the transfer module 72 are closed (at about 440 scans). At the pressure conditions of 550/700/450 mTorr, respectively, the movements of the impurities are constant. When the load lock chamber 72a and the transfer module 72 are closed (at about 840 scans), the change of movement of $H_2O^+$ is stable. The pressure condition of 450 mTorr shows desirable results, considering the flow of remaining gas toward the load lock chamber 72a and the pressure in the etching chamber which is maintained lower than about 350 mTorr. However, the pressure conditions of the transfer module 72 are not confined to these values. The pressure conditions can be optimized for each processing cycle by considering the process conditions such as pressure in the etching chamber.

Meanwhile, it is also possible to optimize the operating pressure in the transfer module by analyzing the metal contaminants and ion contaminants, etc. on the surface of the wafer, along with an analysis of the movement of the impurities using the RGA-QMS 86. The analysis of the metal contaminants and ion contaminants are done by utilizing TXRF (Total X-Ray Fluorescence) and HPIC (High Performance Ion Chromatography), after processing at least 25 pieces of wafers under various process conditions, putting bare wafers in the flat-zone aligner 80, and then taking them out.

Figure 12:
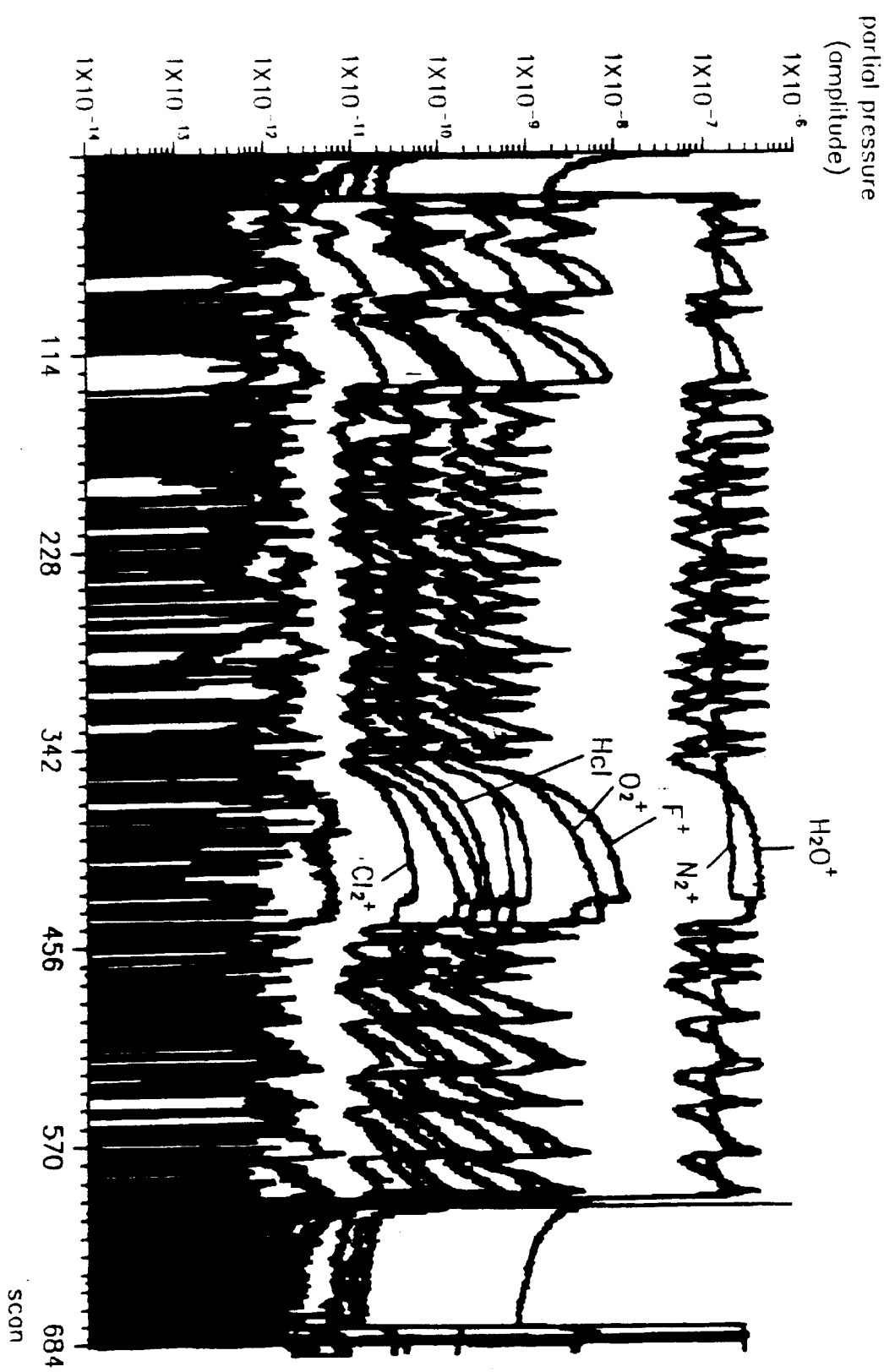
FIG. 12 is a graphical representation of measurements by a RGA-QMS of the movement of the impurities in the load lock chamber during the wafer transfer from the load lock chamber through the transfer module after setting the pressure in the transfer module at 450 mTorr.

FIG. 12 is an RGA-QMS graph illustrating the movements of the impurities in the load lock chamber while carrying the wafers from the load lock chamber through the transfer module after setting the pressure in the transfer module at 450 mTorr. Referring to FIG. 12, main impurities in the load lock chamber are $H_2O^+$, $N_2^+$, $O_2^+$, $F^+$, $Cl^+$, HCl, etc. As the slit valve 79 between the load lock chamber 70a and the transfer module 72 is opened/closed from approximately 135 scans in order to transfer the wafers to the flat-zone aligner 80, the fine movement of the impurities is detected. Generally, in one run of the processed wafers, when the slit valve 79 does not open/close because all the wafers have been moved to the flat-zone aligner 80 (from approximately 350 to 425 scans), the impurities increase. However, for the overall results for one whole run, each impurity is maintained at a relatively constant level without any great changes in the movement.

FIG. 7 shows a further step of purging the load lock chamber after optimizing the pressure in the transfer module 72 by the method shown in FIG. 6 according to one embodiment of the present invention. Referring to FIG. 7, the RGA-QMS 86 is installed (S22) after the sampling manifold 84 is connected to the load lock chamber 70a shown in FIG. 4. Then, a mechanical vacuum pump (not shown) connected to the transfer module 72 and the load lock chamber 70a is operated and $PN_2$ gas is supplied so as to form a vacuum by setting the pressure optimized as in FIG. 6 (S24). Then, the load lock chamber 70a is continuously purged using the $PN_2$ gas (S26). Also, while continuously purging the load lock chamber 70a, it is possible to analyze the impurity movement in the load lock chamber 70a by varying the pressure in the transfer module 72 and using the RGA-QMS 86 as shown in FIG. 6.

Describing it in more detail as shown in FIG. 12, when the wafer transfer stops, the pressure in the load lock chamber 70a is increased due to the outgassing on the inner surface of the load lock chamber 70a, the wafer carrier, and the wafer surface. As described above, $N_2^+$ shows constant movement without significant changes, but $H_2O^+$, $O_2^+$, $H_2^+$, HCl, $CO_2^+$, and $Cl^+$ show abrupt increases in this order.

Because the gas remaining in the etching chambers 76a, 76b can flow back to the load lock chamber 70a via the transfer module 72, the load lock chambers 70a, 70b are continuously purged. $PN_2$ gas is used as the purge gas as mentioned with regard to FIG. 4., and it can be supplied through the line connected to the purge gas supply source 92 for the transfer module 72, or through a separately installed line for the purge gas supply source.

Figure 8:
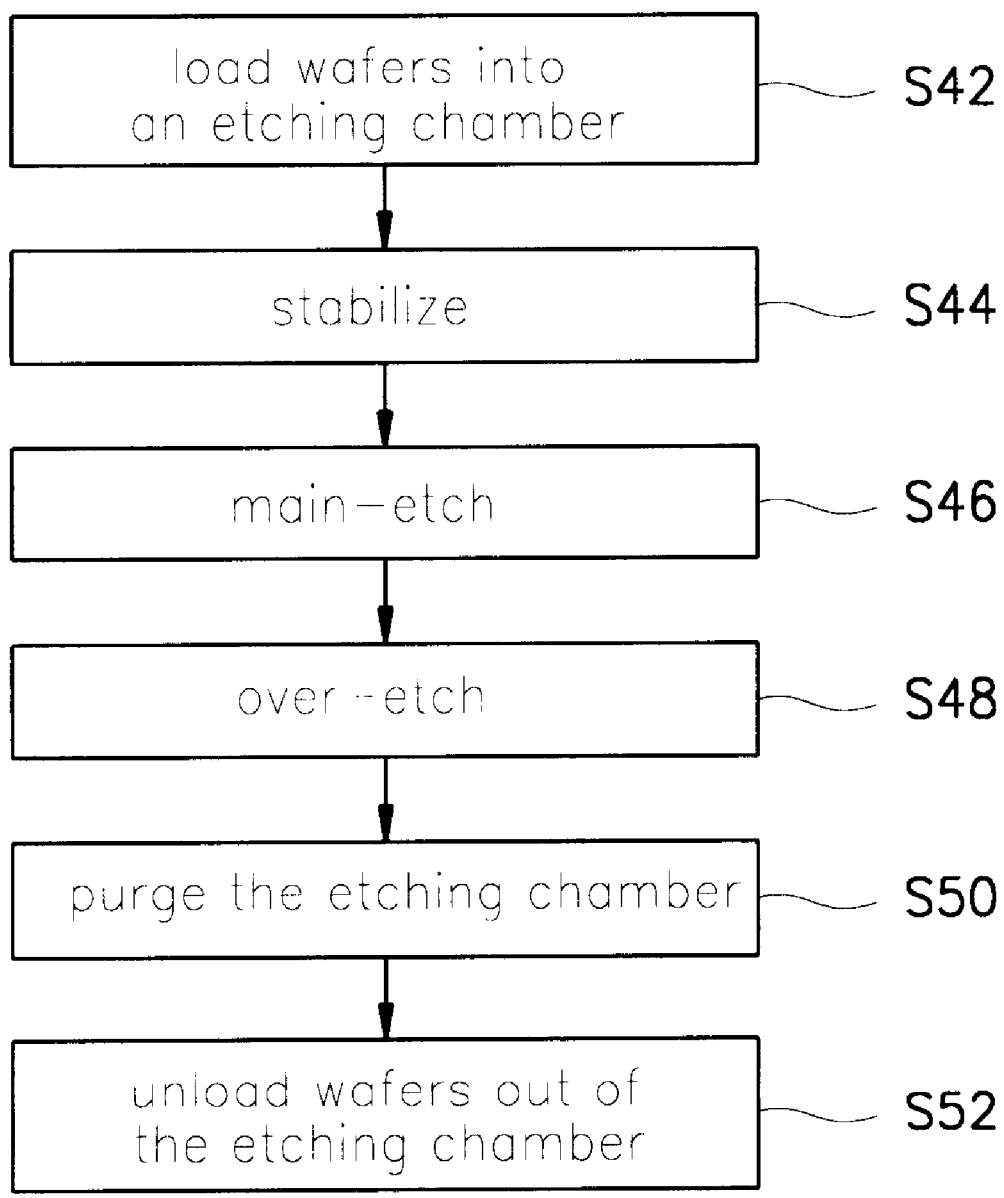
FIG. 8 is a flow chart illustrating the steps for etching metal patterns in an etching chamber of the dry etching system of FIG. 4 according to the present invention.
Figure 9:
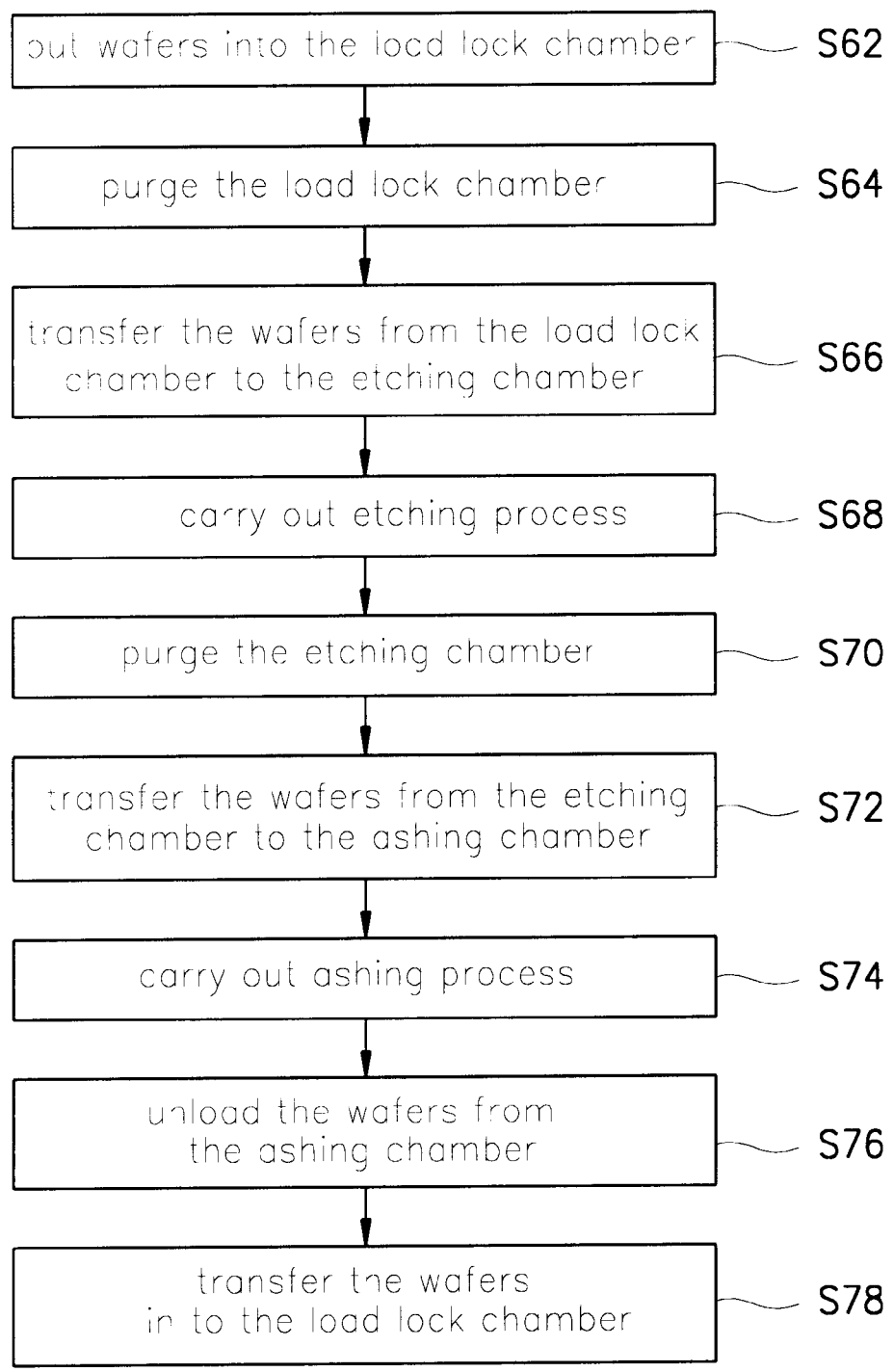
FIG. 9 shows the process sequences of the metallization process carried out in the dry etching system according to the present invention.

Referring to FIG. 8, the method for suppressing the causes of the corrosion failures in the etching chambers 76a, 76b will be described. FIG. 8 shows the sequence of the etching process for the metal pattern formation carried out in the etching chambers 76a, 76b according to the present invention.

First, a wafer having a photoresist pattern formed thereon is loaded into one etching chamber 76a by the robot 74 in the transfer module 72 (S42). Then, the process condition is stabilized by constantly supplying the etching gas into the etching chamber 76a (S44). Then, by forming plasma over the wafer in the etching chamber 76a and using the photoresist pattern as an etch mask, the main-etch process for the metal pattern formation is carried out until the sub-layer under the metal material layer is exposed at the etch-end point (S46). Then, over-etch is carried out while constantly maintaining the same etching conditions as in the main-etch for a certain period of time (S48). Then, $PN_2$ gas is supplied as purging gas in order to remove the by-products or gas remaining in the etching chamber 76a (S50). After the purge is sufficiently done, the wafers are unloaded from the etching chamber 76a and moved to another place for subsequent processing (S52).

The following Table 1 shows the etching process recipe for the aluminum metal patterning process carried out according to an embodiment of the present invention.

TABLE 1

| Steps | stabilization | Main-etch | over-etch | purge |
| --- | --- | --- | --- | --- |
| Control elements | time | Etch-end point | Time | time |
| Time (sec.) | 5–30 | 50–150 | 50–150 | 0–100 |
| $BCl_3$ (sccm) | 10–100 | 10–100 | 10–100 | — |
| $Cl_2$ (sccm) | 10–100 | 10–100 | 10–100 | — |
| $N_2$ (sccm) | 10–100 | 10–100 | 10–100 | 0–200 |
| RF (W) | 0–1000 | 0–1000 | 0–1000 | 0–1000 |
| Gauss | 0–200 | 0–200 | 0–200 | 0–200 |
| Pressure (mTorr) | 50–300 | 50–300 | 50–300 | 50–300 |

When purging the etching chamber using $PN_2$ gas after the over-etch as described above, the results monitored by the RGA-QMS connected to the etching chamber shows that the level of the remaining $Cl^+$ and $HCl^+$ has been significantly reduced. When the metal impurities on the polymer formed on the sidewalls of the metal pattern after the etching process were analyzed by a TXRF, there were 631E10 atoms/cm² of Cl when there was no purge. However, Cl increased to 4582E10 atoms/cm² when there was purge. According to the analysis results by an HPIC, there were 810E10 atoms/cm² of Cl when there was no purge, but Cl increased to 2070E10 atoms/cm² when there was purge. This is because the remaining gas such as $Cl_2^+$ $Cl^+$, and $HCl^+$, etc. are attached to the polymer formed on the sidewalls of the metal pattern on the wafer surface by the $PN_2$ purge gas in the purging step. The polymer can be easily removed in the following ashing step.

As described above, the corrosion failure in the aluminum metal pattern can be remarkably reduced by optimizing the pressure in the transfer module 72, continuously purging the load lock chamber 70a, and adding a purging step after the etching process is completed in the etching chamber 76a.

Referring to FIGS. 5A to 5D and FIG. 9, a detailed description of a process for forming a metal pattern on semiconductor devices is provided hereinafter as an example.

First, wafers loaded in a cassette or in a carrier are put into the load lock chamber 70a (S62). On the wafer, an aluminum metal material layer 62 is formed over BPSG (Boron Phosphorus Silicate Glass) 60 on a semiconductor substrate, and a TiN (titanium nitride) layer is formed on the aluminum metal material layer 62 as a capping layer 64. A photoresist pattern 66 is formed on the TiN layer. A titanium/titanium nitride layer may be further formed between the BPSG 60 and the metal material layer 62.

Then, after putting the wafers in the load lock chamber 70 and closing the door (not shown), the load lock chamber 70a is purged (S64). $PN_2$ gas is used as the purge gas as described in FIG. 7, and a vacuum pump (not shown) between the transfer module 72 and the load lock chamber 70a is operated to maintain the load lock chamber 70a at a certain level of vacuum.

Then, the robot 74 in the transfer module 72 transfers the wafers from the load lock chamber 70a into the flat-zone aligner 80. The wafers are aligned in the flat-zone aligner 80, and then are moved into the etching chamber 76a (S66).

Then, the etching process for the metallization process is carried out in the etching chamber 76a (S68). The etching process is carried out according to the process recipe in Table 1. At this time, a native aluminum oxide may be removed, which is formed on the surface of the aluminum when the aluminum is exposed to the atmosphere.

Figure 5A:
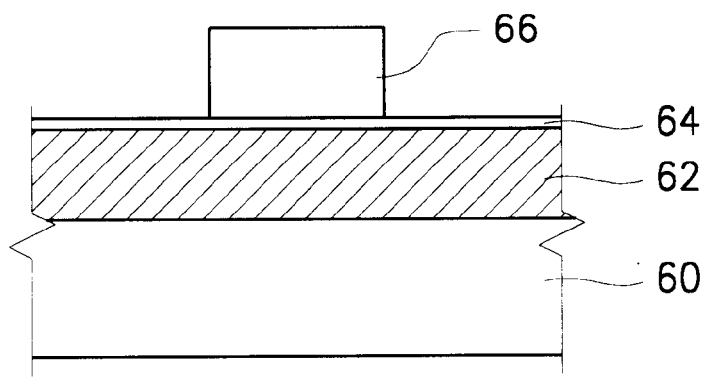
FIGS. 5A to 5D are cross-sectional views of semiconductor devices processed according to processing steps carried out in the dry etching system of FIG. 4.
Figure 5B:
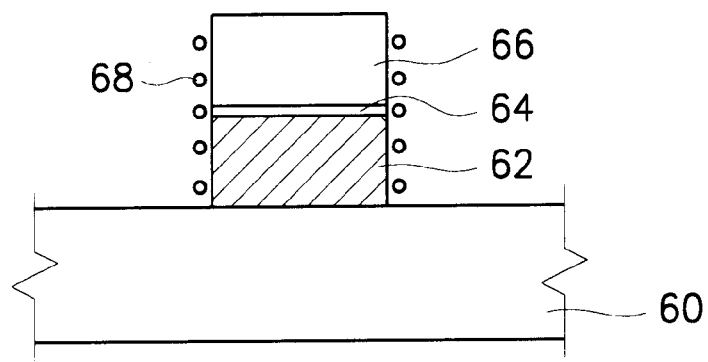

FIG. 5B is a cross-sectional view of the semiconductor device showing that the etching process is completed. Chlorine ($Cl_2$) components 68, which are by-products of the etching process, are attached on the sidewalls of the etched metal pattern 62 and the photoresist pattern 66.

Then, after the over-etch is completed, the etching chamber 76a is purged (S70), which is also carried out by the process recipe in Table 1.

Then, the wafers are unloaded to the robot 74 in the transfer module 72, and are put into any one of the ashing chambers 78a, 78b (S72). The ashing process is carried out in the ashing chambers 78a, 78b (S74). By the ashing process, the photoresist pattern 66 remaining on the metal pattern and the residues attached to the sidewalls of the metal pattern are removed. In order to remove chlorine ($Cl_2$) 68 remaining during the aluminum etching process, a VDS (Vapor Delivery System) is employed to supply water ($H_2O$). The process recipe for the ashing process is shown in Table 2.

TABLE 2

| Steps | Stabilization | passivation | Strip | Strip | pump down |
|---|---|---|---|---|---|
| Control elements | Time | Etch-end point | Time | Time | Time |
| Time (sec.) | 5–30 | 50–150 | 5–30 | 50–150 | 5–30 |
| $H_2O$ (sccm) | 10–1000 | 10–1000 | — | — | — |
| $O_2$ (sccm) | — | — | –5000 | –5000 | — |
| $N_2$ (sccm) | — | — | 50–500 | 50–500 | — |

TABLE 2-continued

| Steps | Stabilization | passivation | Strip | Strip | pump down |
|---|---|---|---|---|---|
| RF (W) | 0–2000 | 0–2000 | 0–2000 | 0–2000 | — |
| Temperature (° C.) | 0–350 | 0–350 | 0–350 | 0–350 | 0–350 |

Water vapor ($H_2O$) is used to remove the chlorine ($Cl_2$) during the strip of the photoresist, and oxygen ($O_2$) and nitrogen ($N_2$) are supplied for the photoresist strip. The present invention is not confined to the process recipe shown in Table 2. For example, the passivation and the strip can be carried out many times repeatedly by separate processing cycles or at the same time.

Figure 5C:
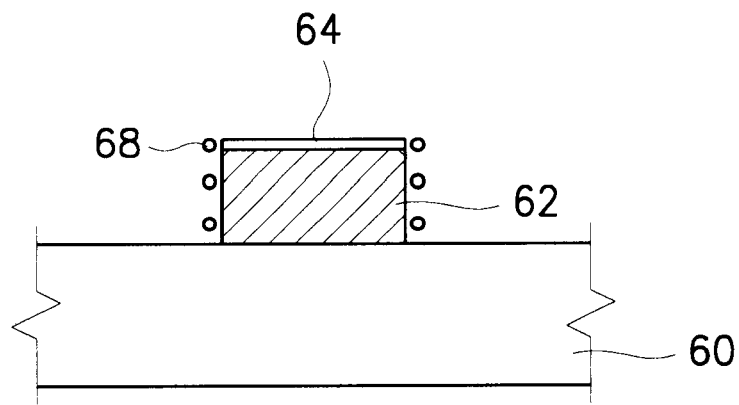
Figure 5D:
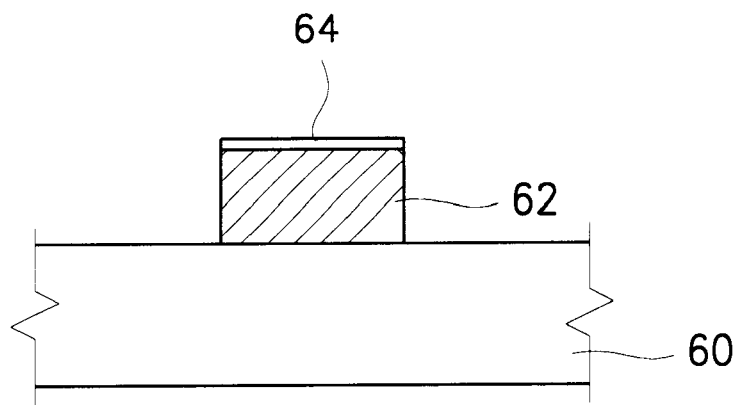

FIG. 5C shows that the photoresist pattern 66 is stripped, and FIG. 5D shows that the chlorine ($Cl_2$) 68 accumulated on the sidewalls of the metal pattern is removed by the passivation.

Then, the wafers are unloaded from the ashing chambers 78a, 78b (S76), and transferred into the load lock chamber 70a (S78). Alternatively, the wafers can be cooled down in a cooling chamber 82 before being transferred into the load lock chamber 70a.

As described above, according to the present invention, the corrosion failures in aluminum patterns can be suppressed in the etching chamber, the transfer module, and the load lock chamber. Further, the process is stabilized, and production yield and reliability can be improved.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A metallization process for manufacturing semiconductor devices, comprising the steps of:

a) loading a semiconductor wafer into a load lock chamber, the semiconductor wafer having a photoresist pattern formed over a metal material layer to be etched;

b) pumping and purging the load lock chamber;

c) transferring the semiconductor wafer from the load lock chamber into an etching chamber via a transfer module, the transfer module being maintained under vacuum conditions and being purged;

d) etching the metal material layer by using the photoresist pattern as an etch mask while supplying etching gas containing chlorine to form a metal pattern;

e) purging the etching chamber after the etching step;

f) transferring the wafer from the etching chamber into an ashing chamber via the transfer module, the transfer module being maintained under vacuum conditions;

g) performing an ashing process on the metal pattern in the ashing chamber; and h) transferring the wafer from the ashing chamber into the load lock chamber via the transfer module, the load lock chamber being continuously purged and the pressure in the load lock chamber and the transfer module being maintained higher than that in the etching chamber and the ashing chamber, in order to prevent the gas remaining in the etching chamber and the ashing chamber from flowing back into the load lock chamber and the transfer module.

2. The metallization process of claim 1, wherein the metal material layer contains aluminum.

3. The metallization process of claim 2, wherein the etching gas includes boron chloride and chlorine.

4. The metallization process of claim 1, wherein the pressure in the load lock chamber and the transfer module is maintained higher than that in the etching chamber and the ashing chamber, in order to prevent the gas remaining in the etching chamber and the ashing chamber from flowing back into the load lock chamber and the transfer module.

5. The metallization process of claim 4, wherein the pressure in the transfer module is set by connecting an RGA-QMS (Residual Gas Analyzer-Quadrupole Mass Spectrometer) to the load lock chamber and analyzing the movements of impurities in the load lock chamber while changing the pressure in the transfer module.

6. The metallization process of claim 4, wherein the pressure in the etching chamber is from 50 to 300 mTorr, and the pressure in the load lock chamber and the transfer module is maintained at a level higher than 300 mTorr.

7. The metallization process of claim 6, wherein the pressure in the etching chamber is from about 50 to 300 mTorr, and the pressure in the transfer module is set at about 450 mTorr.

8. The metallization process of claim 1, wherein the ashing process comprises a strip process for removing the photoresist pattern remaining on the metal pattern and a passivation process for removing chlorine components remaining on the side walls of the metal pattern, both of the processes being carried out at least one time.

9. The metallization process of claim 1, wherein the step of etching the metal material layer further comprises the steps of:

a) stabilizing the environment in the etching chamber;

b) main-etching the metal material layer to an etch-end point by using the photoresist pattern as an etch mask while supplying etching gas containing chlorine into the etching chamber; and c) over-etching the metal material layer over the etch-end point so as to form the metal pattern.

10. The metallization process of claim 1, wherein the load lock chamber, the transfer module, and the etching chamber are purged by supplying purified nitrogen gas.

11. The metallization process of claim 1, further comprising the step of aligning the flat zone of the wafer prior to the step of transferring the wafer from the load lock chamber into the etching chamber via the transfer module, the transfer module being purged.

12. The metallization process of claim 1, wherein the wafer unloaded from the ashing chamber is cooled in a cooling chamber before the wafer is transferred into the load lock chamber.

* * * * *